United States Patent
Huang et al.

(10) Patent No.: US 10,958,294 B2
(45) Date of Patent: Mar. 23, 2021

(54) DECODING DEVICE AND DECODING METHOD

(71) Applicant: Realtek Semiconductor Corp., HsinChu (TW)

(72) Inventors: Wei-Chieh Huang, Hsinchu County (TW); Chung-Yen Liu, Tainan (TW); Yi-Syun Yang, Kinmen County (TW); Chung-Yao Chang, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 9 days.

(21) Appl. No.: 16/520,283

(22) Filed: Jul. 23, 2019

(65) Prior Publication Data
US 2020/0112325 A1    Apr. 9, 2020

(30) Foreign Application Priority Data
Oct. 4, 2018   (TW) .................. 107135086

(51) Int. Cl.
*H03M 13/37* (2006.01)
*H03M 13/29* (2006.01)
*H03M 13/09* (2006.01)
*H03M 13/11* (2006.01)

(52) U.S. Cl.
CPC ....... *H03M 13/3746* (2013.01); *H03M 13/09* (2013.01); *H03M 13/1128* (2013.01); *H03M 13/2927* (2013.01)

(58) Field of Classification Search
CPC ............. H03M 13/09; H03M 13/1128; H03M 13/2771; H03M 13/2957; H03M 13/3746; H03M 13/2927
See application file for complete search history.

(56) References Cited

U.S. PATENT DOCUMENTS

| | | | |
|---|---|---|---|
| 6,988,234 B2 * | 1/2006 | Han | H03M 13/2771 714/755 |
| 9,966,972 B1 | 5/2018 | Zhong | |
| 2013/0185610 A1 * | 7/2013 | Ould-Cheikh-Mouhamedou | H03M 13/2957 714/752 |
| 2018/0351581 A1 * | 12/2018 | Presman | H04L 1/0057 |

OTHER PUBLICATIONS

Van Welden et al., Iterative decision directed joint frequency offset and channel estimation for KSP_OFDM, IEEE Trans. on. Comm. vol. 60, No. 10, pp. 3103-3110. (Year: 2012).*

* cited by examiner

*Primary Examiner* — Shelly A Chase
(74) *Attorney, Agent, or Firm* — Winston Hsu (57) ABSTRACT

The present disclosure provides a decoding device. The decoding device includes an iteration number computing unit and a recursive decoder. The iteration number computing unit receives multiple packet parameters corresponding to a packet and computes a codeword-number-per-symbol according to packet parameters, in which the packet includes multiple symbols. The iteration number computing unit computes an iteration number according to the codeword-number-per-symbol. The recursive decoder is coupled to the iteration number computing unit, and performs a decoding operation on a codeword within a data field of the packet according to the iteration number.

19 Claims, 6 Drawing Sheets

DECODING DEVICE AND DECODING METHOD

BACKGROUND OF THE INVENTION

1. Field of the Invention

The present disclosure relates to a decoding device and a decoding method, and more particularly, to a decoding device and a decoding method capable of effectively managing the decoding latency.

2. Description of the Prior Art

The error correction code is an indispensable part of the receiving end of the communication system. Conventional error correction code decoder, e.g., a low density parity check code decoder or a turbo code decoder, requires a recursive decoding operation, and the decoding performance will increase as the number of recursions increases. The prior art has been developed to increase the number of times according to channel conditions or SNR (signal-to-noise ratio) to improve performance.

However, in many communication systems, the latency of the receiving end must be limited. The receiving end must complete the process of receiving the packet within the transmission delay time constraint thereof, or even return the acknowledgement (ACK) packet to accomplish the complete transmission-and-reception process. On the other hand, each packet carries different amount of data (i.e., payload). If the SNR is the only concern for adjusting the iteration number of the decoding operation, it may cause too much decoding latency, which may be not good for to the operation of the communication systems.

Therefore, how to effectively manage the decoding latency is a significant objective in the field.

SUMMARY OF THE INVENTION

It is a primary objective of the present disclosure to provide a decoding device and a decoding method capable of effectively managing the decoding latency, to improve over disadvantages of the prior art.

The present disclosure provides a decoding device includes an iteration number computing unit and a recursive decoder. The iteration number computing unit receives multiple packet parameters corresponding to a packet and computes a codeword-number-per-symbol according to packet parameters, in which the packet includes multiple symbols. The iteration number computing unit computes an iteration number according to the codeword-number-per-symbol. The recursive decoder is coupled to the iteration number computing unit, and performs a decoding operation on a codeword within a data field of the packet according to the iteration number.

The present disclosure provides a decoding device. The decoding device includes a recursive decoder, an early termination determining unit and an iteration number computing unit. The recursive decoder receives a first codeword and a first upper-bound-of-iteration-time of a packet and performs a decoding process on the first codeword according to the first upper-bound-of-iteration-time. The early termination determining unit determines whether the decoding process performed by the recursive decoder on the first codeword can be early terminated, in which the early termination determining unit outputs a first actual decoding time corresponding to the first codeword when the early termination determining unit determines that the decoding process of decoding the first codeword can be early terminated, and the first actual decoding time is less than the first upper-bound-of-iteration-time. The iteration number computing unit obtains a defaulted upper-bound-of-iteration-time and compute a second upper-bound-of-iteration-time corresponding to a second codeword, in which the second upper-bound-of-iteration-time is the defaulted upper-bound-of-iteration-time plus a residual time, and the residual time is the first upper-bound-of-iteration-time minus the first actual decoding time.

The present disclosure provides a decoding method, applied in a decoding device. The decoding method includes receiving multiple packet parameters corresponding to a packet, and computing a codeword-number-per-symbol according to the plurality of packet parameters, in which the packet includes multiple symbols, and each symbol includes at least a codeword; computing an iteration number according to the codeword-number-per-symbol; and performing a decoding operation on a codeword within a data field of the packet according to the iteration number.

These and other objectives of the present invention will no doubt become obvious to those of ordinary skill in the art after reading the following detailed description of the preferred embodiment that is illustrated in the various figures and drawings.

DETAILED DESCRIPTION

Various functional components, blocks or units are described as follows. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuity in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

Figure 1:
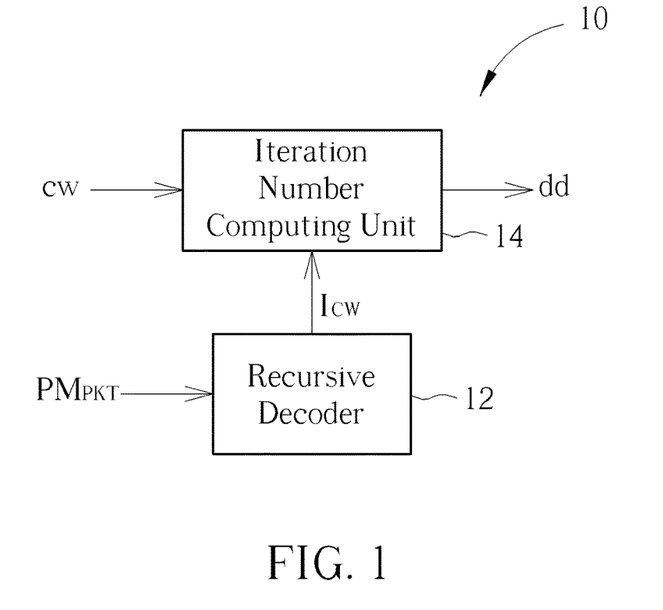
FIG. 1 is a schematic diagram of a decoding device according to an embodiment of the present disclosure.
Figure 2:
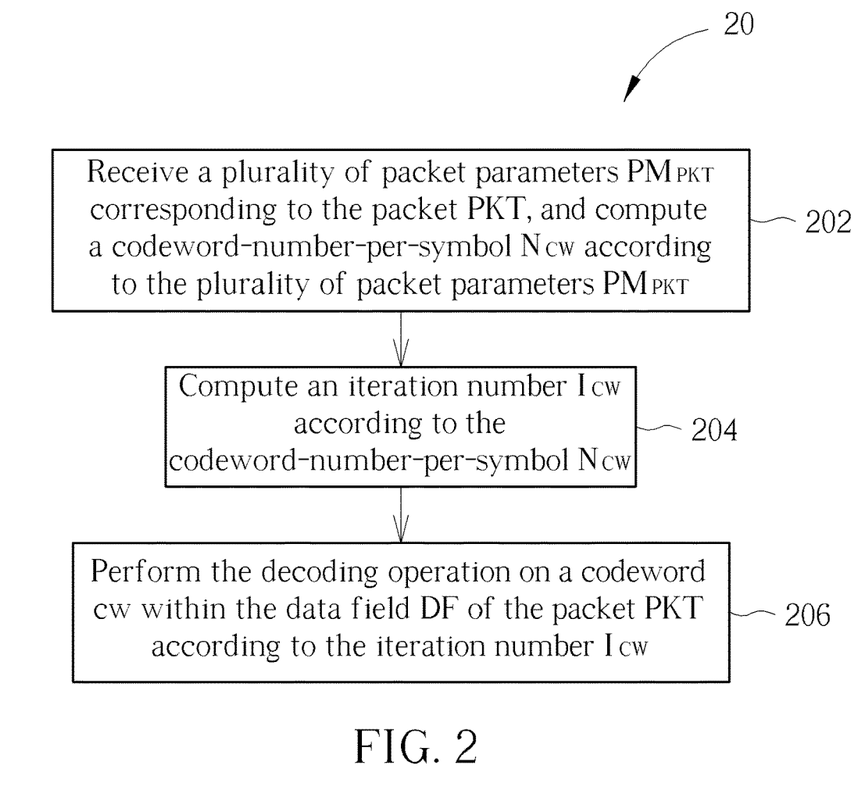
FIG. 2 is a schematic diagram of a decoding process according to an embodiment of the present disclosure.
Figure 5:
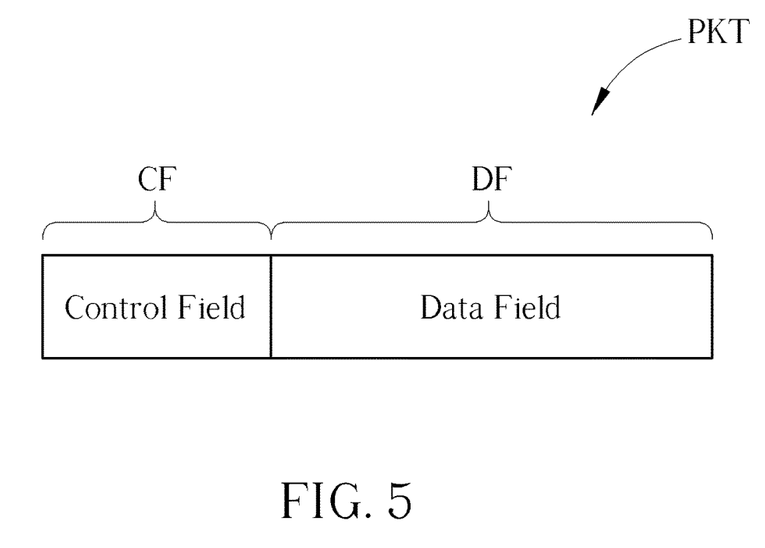
FIG. 5 is a schematic diagram of a packet format of a packet

FIG. 1 is a schematic diagram of a decoding device 10 according to an embodiment of the present disclosure. FIG. 2 is a schematic diagram of a decoding process 20 according to an embodiment of the present disclosure. The decoding device 10 may be disposed within a receiving device of a communication system, where the communication system may be an LTE system or a WLAN system, which is not limited thereto. The receiving device may receive a packet PKT of the communication system. As shown in FIG. 5, the packet PKT comprises a control field CF and a data field DF. In addition, the packet PKT may comprise a plurality of symbols, and each symbol may be an OFDM (orthogonal frequency division multiplexing) symbol which comprises at least a codeword cw. The decoding device 10 is configured to perform a decoding operation/process on the plurality of codewords cw in the data field DF, so as to generate decoded data dd correspondingly. The codeword cw may be an LDPC (low density parity check code), a turbo code or any other error correcting code which requires recursive decoding process. The decoding device 10 may adjust the iteration number(s) of the decoding process for the codeword(s) cw within the packet PKT according to the payload of the packet PKT, so as to effectively manage the latency brought by the decoding operation performed by the decoding device 10.

The decoding device 10 comprises an iteration number computing unit 12 and a recursive decoder 14. The iteration number computing unit 12 receives a plurality of packet parameters $PM_{PKT}$ corresponding to the packet PKT, and computes a codeword-number-per-symbol $N_{CW}$ according to the plurality of packet parameters $PM_{PKT}$ (Step 202). The iteration number computing unit 12 computes an iteration number $I_{CW}$ according to the codeword-number-per-symbol $N_{CW}$ (Step 204). The recursive decoder 14 is coupled to the iteration number computing unit 12 to receive the iteration number $I_{CW}$. The recursive decoder 14 performs the decoding operation on a codeword cw within the data field DF of the packet PKT according to the iteration number $I_{CW}$ (Step 206). The codeword-number-per-symbol $N_{CW}$ may be a number of codewords carried by a single symbol on average. The iteration number $I_{CW}$ may be an upper bound of iteration number of the decoding operation performed by the recursive decoder 14 on the codeword cw, which means that, the recursive decoder 14 performs at most $I_{CW}$ iterations within the decoding process on the codeword cw.

The plurality of packet parameters $PM_{PKT}$ in Step 202 may comprise a packet time length $T_{time}$, a guard interval length $N_{GI}$ of the packet PKT, and/or a data payload length $N_{pld}$, a bit number per packer (number of available bit) $N_{avbit}$, a symbol interval $T_{SYM}$ or a modulation coding scheme index MCS of the packet PKT in the data field DF. The plurality of packet parameters $PM_{PKT}$ may be obtained/decoded directly from the control information of the control field CF, or obtained by the receiving device's computation of the control information in the control field CF. Take WLAN for example, the packet time length $T_{time}$, the guard interval length $N_{GI}$, and the data payload length $N_{pld}$ may be obtained/decoded, by the receiving device, from the fields related to the fields of SIG/SIG-A/SIG-B in the control field CF. For the LTE system, the plurality of packet parameters $PM_{PKT}$ may be obtained/decoded, by the receiving device, from PDCCH (physical downlink control channel) related to DCI (downlink control information).

In an embodiment, for the packet PKT, the iteration number computing unit 12 may determine an iteration number $I_{CW\_PKT}$ corresponding to the packet PKT according to the plurality of packet parameters $PM_{PKT}$. The iteration number $I_{CW\_PKT}$ is applied for all of the codewords cw within (the data field of) the packet PKT. For another packet PKT', the iteration number computing unit 12 may determine another iteration number $I_{CW\_PKT'}$ corresponding to the packet PKT' according to the plurality of packet parameters $PM_{PKT'}$, and the iteration number $I_{CW\_PKT'}$ is applied for all of the codewords cw within (the data field of) the packet PKT'.

Figure 3:
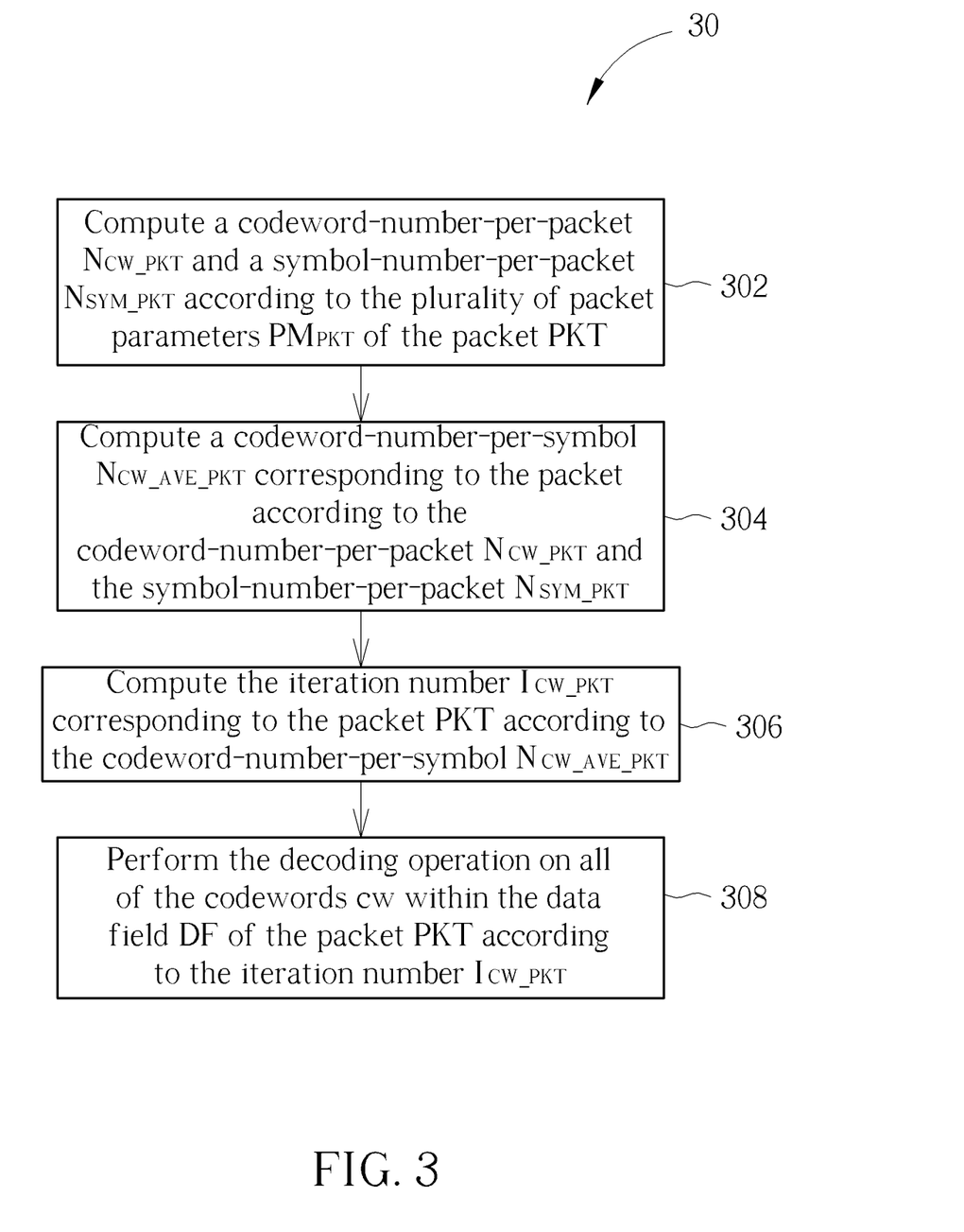
FIG. 3 is a schematic diagram of a decoding process according to an embodiment of the present disclosure.

FIG. 3 is a schematic diagram of a decoding process 30 executed by the decoding device 10 according to an embodiment of the present disclosure. The decoding process 30 may generate the iteration number $I_{CW\_PKT}$ corresponding to the packet PKT, and the decoding process comprises the following steps:

Step 302: Compute a codeword-number-per-packet $N_{CW\_PKT}$ and a symbol-number-per-packet $N_{SYM\_PKT}$ according to the plurality of packet parameters $PM_{PKT}$ of the packet PKT.

Step 304: Compute a codeword-number-per-symbol $N_{CW\_AVE\_PKT}$ corresponding to the packet according to the codeword-number-per-packet $N_{CW\_PKT}$ and the symbol-number-per-packet $N_{SYM\_PKT}$.

Step 306: Compute the iteration number $I_{CW\_PKT}$ corresponding to the packet PKT according to the codeword-number-per-symbol $N_{CW\_AVE\_PKT}$.

Step 308: Perform the decoding operation on all of the codewords cw within the data field DF of the packet PKT according to the iteration number $I_{CW\_PKT}$.

Take the WLAN system as an example, in Step 302, the iteration number computing unit 12 may compute the OFDM symbol number within the packet PKT, i.e., the symbol-number-per-packet $N_{SYM\_PKT}$, according to the packet time length $T_{time}$ and the guard interval length $N_{GI}$ among the plurality of packet parameters $PM_{PKT}$. In addition, the iteration number computing unit 12 may obtain the codeword number within the packet PKT, i.e., the codeword-number-per-packet $N_{CW\_PKT}$, according to the data payload length $N_{pld}$, the bit number per packer $N_{avbit}$, a code rate R and TABLE I. Moreover, the iteration number computing unit 12 may obtain the code rate R according to the modulation coding scheme index MCS and TABLE II. In TABLE I, ⌈ ⌉ represents the ceiling function or the round-up (to the least integer greater than the input argument) operation.

TABLE I

| Bit number per packer $N_{avbit}$ | $N_{CW\_PKT}$ | Codeword length (bits) |
|---|---|---|
| $N_{avbit} \leq 648$ | 1 | 1296, if $N_{avbit} \geq N_{pld}$ + 912 × (1-R) 648, otherwise |
| $648 < N_{avbit} \leq 1296$ | 1 | 1944, if $N_{avbit} \geq N_{pld}$ + 1464 × (1-R) 1296, otherwise |
| $1296 < N_{avbit} \leq 1944$ | 1 | 1944 |
| $1944 < N_{avbit} \leq 2592$ | 2 | 1944, if $N_{avbit} \geq N_{pld}$ + 2196 × (1-R) 1296, otherwise |
| $2592 < N_{avbit}$ | $\left\lceil \dfrac{N_{pld}}{1944 \cdot R} \right\rceil$ | 1944 |

TABLE II

| MCS | Modulation | R | $N_{BPSCS}$ |
|---|---|---|---|
| 0 | BPSK | 1/2 | 1 |
| 1 | QPSK | 1/2 | 2 |
| 2 | QPSK | 3/4 | 2 |
| 3 | 16-QAM | 1/2 | 4 |
| 4 | 16-QAM | 3/4 | 4 |
| 5 | 64-QAM | 2/3 | 6 |
| 6 | 64-QAM | 3/4 | 6 |
| 7 | 64-QAM | 5/6 | 6 |
| 8 | 256-QAM | 3/4 | 8 |
| 9 | 256-QAM | 5/6 | 8 |

In Step 304, the iteration number computing unit 12 may compute the codeword-number-per-symbol $N_{CW\_AVE\_PKT}$ as $$N_{CW\_AVE\_PKT} = \frac{N_{CW\_PKT}}{N_{SYM\_PKT}} \text{ or } N_{CW\_AVE\_PKT} = \left\lceil \frac{N_{CW\_PKT}}{N_{SYM\_PKT}} \right\rceil,$$

where the codeword-number-per-symbol $N_{CW\_AVE\_PKT}$ represents a number of codewords carried by each OFDM symbol on average within the packet PKT.

In Step 306, the iteration number computing unit 12 may compute a decoding-time-per-codeword $T_{CW\_AVE\_PKT}$, for each codeword cw within the packet PKT on average, as $$T_{CW\_AVE\_PKT} = \frac{T_{SYM}}{N_{CW\_AVE\_PKT}},$$

according to the OFDM symbol interval $T_{SYM}$ and the codeword-number-per-symbol $N_{CW\_AVE\_PKT}$. Then, the iteration number computing unit 12 computes the iteration number $I_{CW\_PKT}$ corresponding to the packet PKT as $$I_{CW\_PKT} = \left\lfloor \frac{T_{CW\_AVE\_PKT}}{T_{itr}} \right\rfloor \text{ or } I_{CW\_PKT} = \left\lceil \frac{T_{CW\_AVE\_PKT}}{T_{itr}} \right\rceil$$

according to the decoding-time-per-codeword $T_{CW\_AVE\_PKT}$ and a single iteration time $T_{itr}$, wherein $\lfloor \ \rfloor$ represents the flooring function or the round-down (to the greatest integer less than the input argument) operation, and the single iteration time $T_{itr}$ is the time consumed for one single iteration of the decoding operation/process, which may be computed off-line, be computed through the circuit design process, or be obtained by measurement.

In Step 308, the recursive decoder 14 treats the iteration number $I_{CW\_PKT}$ as the upper bound of iteration numbers/times for each codeword cw within the packet PKT when the decoding operation is performed. For example, suppose $I_{CW\_PKT}$=10, the recursive decoder 14 may perform 10 decoding iterations on each codeword cw, or perform at most 10 decoding iterations on each codeword cw. In other words, even if the recursive decoder 14 has performed the 10 decoding iterations on a codeword $cw_n$ but the codeword $cw_n$ still cannot be successfully decoded, the recursive decoder 14 shall abandon the codeword $cw_n$ and proceed to perform decoding on a next codeword $cw_{n+1}$. On the other hand, even if the codeword $cw_n$ is successfully decoded by only consuming 4 decoding iterations, the decoding device 10 shall wait 6 times of iteration time $T_{itr}$ and then be allowed to proceed to perform decoding on the next codeword $cw_{n+1}$.

In another embodiment, the iteration number computing unit 12 may determine an iteration number $I_{CW\_SYM\_i}$ corresponding to the $i^{th}$ symbol (i.e., the specific symbol) within the packet PKT, according to the plurality of packet parameters $PM_{PKT}$. The iteration number $I_{CW\_SYM\_i}$ is applied for all the codewords cw within the $i^{th}$ symbol.

Figure 4:
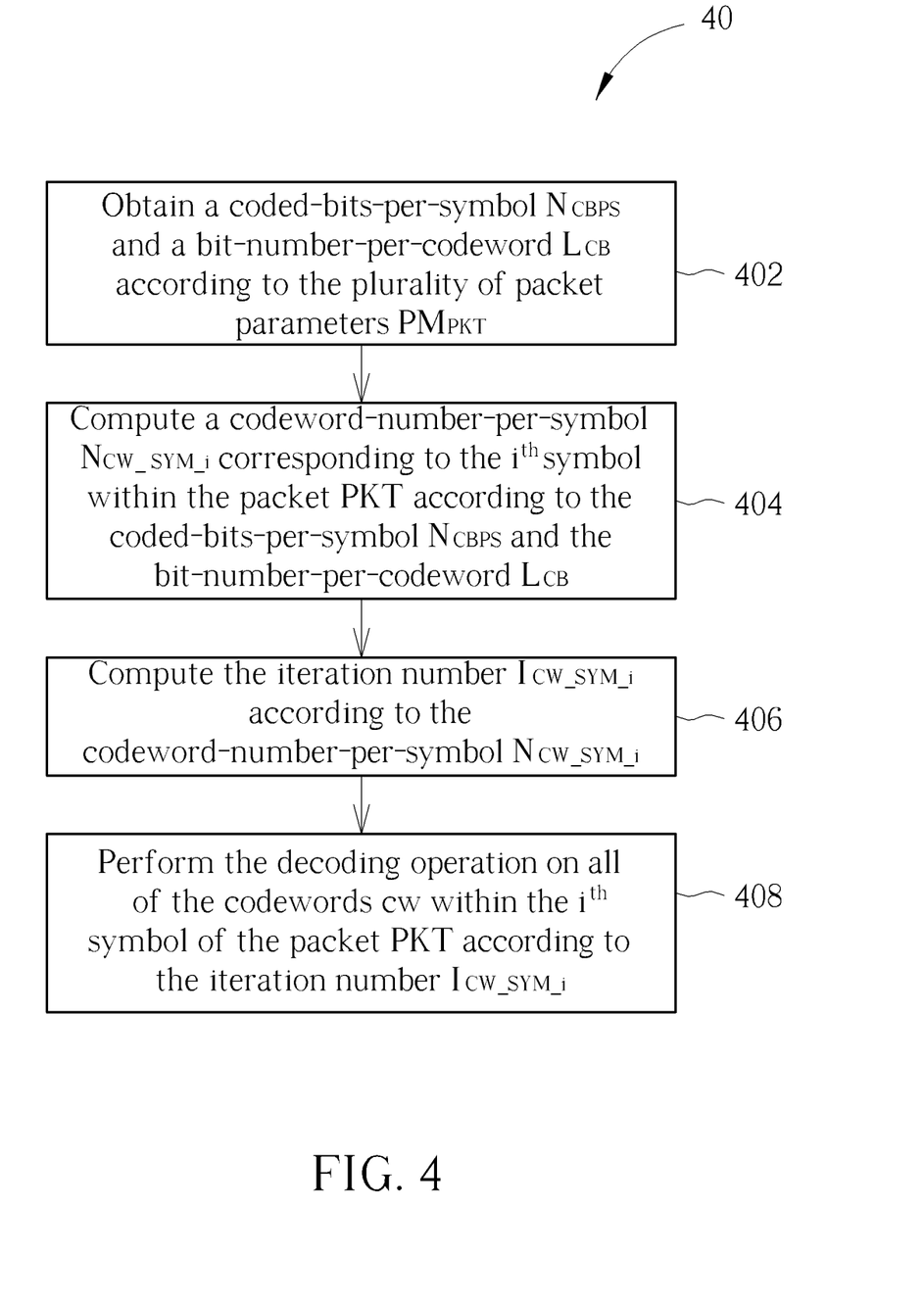
FIG. 4 is a schematic diagram of a decoding process according to an embodiment of the present disclosure.

FIG. 4 illustrates a decoding process 40 executed by the decoding device 10. The decoding process 40 may generate the iteration number $I_{CW\_SYM\_i}$ corresponding to the $i^{th}$ symbol, and the decoding process comprises the following steps:

Step 402: Obtain a coded-bits-per-symbol $N_{CBPS}$ and a bit-number-per-codeword $L_{CB}$ according to the plurality of packet parameters $PM_{PKT}$.

Step 404: Compute a codeword-number-per-symbol $N_{CW\_SYM\_i}$ corresponding to the $i^{th}$ symbol within the packet PKT according to the coded-bits-per-symbol $N_{CBPS}$ and the bit-number-per-codeword $L_{CB}$.

Step 406: Compute the iteration number $I_{CW\_SYM\_i}$ according to the codeword-number-per-symbol $N_{CW\_SYM\_i}$.

Step 408: Perform the decoding operation on all of the codewords cw within the $i^{th}$ symbol of the packet PKT according to the iteration number $I_{CW\_SYM\_i}$.

Take the WLAN system as the example, in Step 402, the coded-bits-per-symbol $N_{CBPS}$ represents a number of coded bits carried by each OFDM symbol. The iteration number computing unit 12 may obtain the number of bits carried by each subcarrier within the $i^{th}$ OFDM symbol, i.e., $B_{BPSCS}$, according to the modulation coding scheme index MCS and TABLE II, and compute the coded-bits-per-symbol $N_{CBPS}$ as $N_{CBPS}=B_{BPSCS} \cdot N_{SD} \cdot N_{SS}$, wherein $N_{SD}$ represents a number of data subcarriers of the $i^{th}$ OFDM symbol, and $N_{SS}$ represents a number of spatial streams. Then, the iteration number computing unit 12 may compute the total number of bits transmitted in the packet PKT $N_{avbit}$ (i.e., the bit number per packer $N_{avbit}$) as $N_{avbit}=N_{CBPS} \cdot N_{SYM\_PKT}$, wherein the method computing the symbol-number-per-packet $N_{SYM\_PKT}$ may be referred to Step 302. Finally, the iteration number computing unit 12 may compute the number of bits (evenly) allocated to each codeword cw within the packet PKT, i.e., the bit-number-per-codeword $L_{CB}$, as $$L_{CB} = \frac{N_{avbit}}{N_{CW\_AVE\_PKT}},$$

wherein the method computing the average codeword-number-per-symbol $N_{CW\_AVE\_PKT}$ within the packet PKT may be referred to Step 304.

In Step 404, the iteration number computing unit 12 may compute the codeword-number-per-symbol $N_{CW\_SYM\_i}$, i.e., the number of codewords carried by the $i^{th}$ symbol within the packet PKT, as $$N_{CW\_SYM\_i} = \left\lfloor \frac{N_{CBPS} + N_{res\_i}}{L_{CB}} \right\rfloor \text{ or } N_{CW\_SYM\_i} = \frac{N_{CBPS} + N_{res\_i}}{L_{CB}},$$

wherein $N_{CBPS}+N_{res\_i}$ may represent an overall number of bits, or an overall-bit-number, to be encoded into the $i^{th}$ symbol, and the residual-bit-number $N_{res\_i}$ represents a number of residual bit after the $(i-1)^{th}$ symbol are encoded as the codewords cw, i.e., a number of bits which are not encoded into the $(i-1)^{th}$ symbol, where the $(i-1)^{th}$ symbol is the previous symbol, the symbol previous to the specific symbol. The residual-bit-number $N_{res\_i}$ may be expressed ad $$N_{res\_i} = (i-1) \cdot N_{CBPS} - \left\lfloor \frac{(i-1) \cdot N_{CBPS}}{L_{CB}} \right\rfloor \cdot L_{CB},$$

where i=1 . . . $N_{SYM\_PKT}$.

Similar to Step 306, the iteration number computing unit 12 in Step 406 may compute a decoding-time-per-codeword $T_{CW\_SYM\_i}$ of each codeword cw within the $i^{th}$ symbol as $$T_{CW\_SYM\_i} = \frac{T_{SYM}}{N_{CW\_SYM\_i}},$$

and compute the iteration number $I_{CW\_SYM\_i}$ corresponding to the $i^{th}$ symbol as $$I_{CW\_SYM\_i} = \left\lfloor \frac{T_{CW\_SYM\_i}}{T_{itr}} \right\rfloor \text{ or } I_{CW\_SYM\_i} = \left\lceil \frac{T_{CW\_SYM\_i}}{T_{itr}} \right\rceil.$$

Similar to Step 308, in Step 408, the recursive decoder 14 treats the iteration number $I_{CW\_SYM\_i}$ as the upper bound of iteration numbers/times for each codeword cw within the $i^{th}$ symbol when the decoding operation is performed.

As can be seen from the above, the decoding device 10 may execute the decoding process 30, to adjust the iteration number for each packet. Alternatively, the decoding device 10 may also execute the decoding process 40, to adjust the iteration number for each symbol. Compared to the decoding process 30, performing the decoding process 40 to adjust the iteration number retains more flexibility, which may have better performance in a long packet or channel varying environment.

Figure 6:
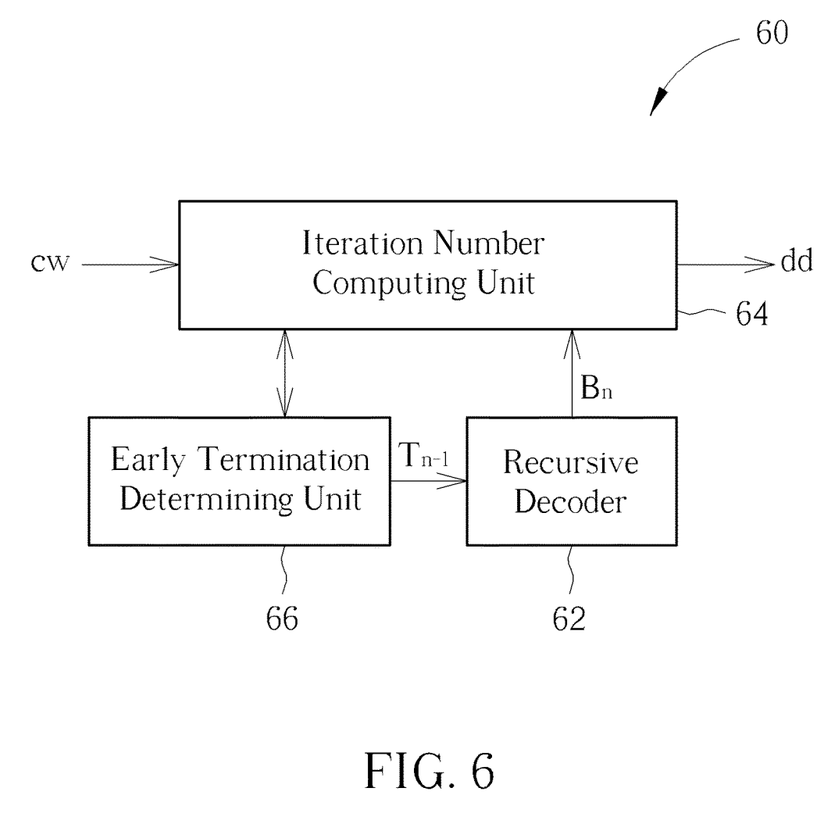
FIG. 6 is a schematic diagram of a decoding device according to an embodiment of the present disclosure.

Furthermore, the decoding device of the present disclosure may further adjust the iteration number for each codeword. FIG. 6 is a schematic diagram of a decoding device 60 according to an embodiment of the present disclosure. Suppose that the $(n-1)^{th}$ codeword $cw_{n-1}$ within the data field DF of the packet PKT is corresponding to an upper-bound-of-iteration-time $B_{n-1}$, the decoding device 60 may observe whether the decoding process performed on the codeword occupies time corresponding to the entire $B_{n-1}$. If not, the decoding process on the codeword $cw_{n-1}$ may be early terminated, and the decoding device 60 may allocate the residual time which is not used for the codeword $cw_{n-1}$ to the time for the decoding process on the codeword $cw_n$, such that the decoding process on the codeword $cw_n$ would have more sufficient time. If the codewords within the data field DF of the packet PKT are all early terminated, the latency due to the decoding operation is significantly reduced.

Figure 8:
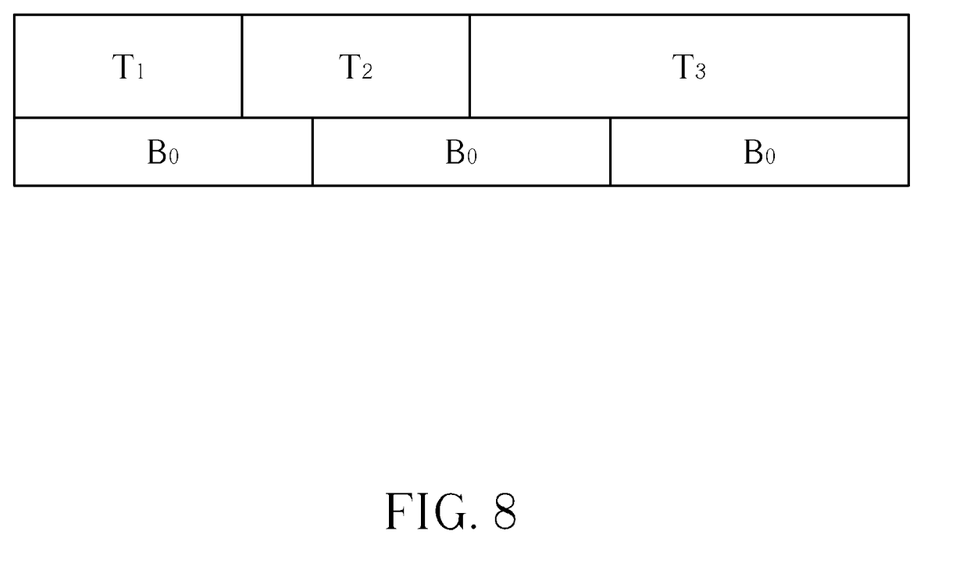
FIG. 8 is a schematic diagram of an actual decoding time and a defaulted upper-bound-of-iteration-time according to an embodiment of the present disclosure.

The decoding device 60 comprises an iteration number computing unit 62, a recursive decoder 64 and an early termination determining unit 66. For the $1^{st}$ codeword $cw_1$ within the data field DF, the recursive decoder 64 may receive an upper-bound-of-iteration-time $B_1$ corresponding to the codeword $cw_1$, and perform the decoding process on the codeword $cw_1$ according to the upper-bound-of-iteration-time $B_1$, wherein the upper-bound-of-iteration-time $B_1$ may be a defaulted upper-bound-of-iteration-time $B_0$, i.e., $B_1 = B_0$. The defaulted upper-bound-of-iteration-time $B_0$ may be obtained by performing the decoding process 30 or the decoding process 40 (i.e., $B_0$ may be computed as $B_0 = I_{CW\_PKT} \cdot T_{itr}$ or $B_0 = I_{CW\_SYM\_i} \cdot T_{itr}$), or the defaulted upper-bound-of-iteration-time $B_0$ may be determined according to practical situation. The early termination determining unit 66 is configured to determine whether the decoding process performed by the recursive decoder 64 on the codeword $cw_1$ can be early terminated. When the early termination determining unit 66 determines that the decoding process on the codeword $cw_1$ can be early terminated, the early termination determining unit 66 may output an actual decoding time $T_1$ corresponding to the codeword $cw_1$, where the actual decoding time $T_1$ is less than the upper-bound-of-iteration-time $B_1$, i.e., $T_1 < B_1$. The iteration number computing unit 62 obtains the defaulted upper-bound-of-iteration-time $B_0$, and compute an upper-bound-of-iteration-time $B_2$ corresponding to the $2^{nd}$ codeword $cw_2$ within the data field DF as $B_2 = B_0 + \Delta T_1$, wherein the residual time $\Delta T_1$ is $\Delta T_1 = B_1 - T_1$. The recursive decoder 64 may perform the decoding process on the codeword $cw_2$ according to the upper-bound-of-iteration-time $B_2$. If the decoding process of the codeword $cw_2$ is early terminated, the iteration number computing unit 62 may allocate the residual time $\Delta T_2$ to (the decoding process on) the 3rd codeword $cw_3$, where $\Delta T_2 = B_2 - T_2$ and $T_2$ is the actual decoding time the codeword $cw_2$. That is, an upper-bound-of-iteration-time $B_3$ corresponding to the codeword $cw_3$ is computed as $B_3 = B_0 + \Delta T_2$, and so on and so forth. The relationship between the actual decoding time $T_1$-$T_3$ of the codewords $cw_1$-$cw_3$ and the defaulted upper-bound-of-iteration-time $B_0$ is illustrated in FIG. 8. As shown in FIG. 8, the residual time$\Delta T_1$, $\Delta T_2$ of the codewords $cw_1$, $cw_2$ may be left to the decoding process of the codeword $cw_3$, such that the decoding process on the codeword $cw_3$ may have longer upper-bound-of-iteration-time $B_3$ or longer actual decoding time $T_3$.

Figure 7:
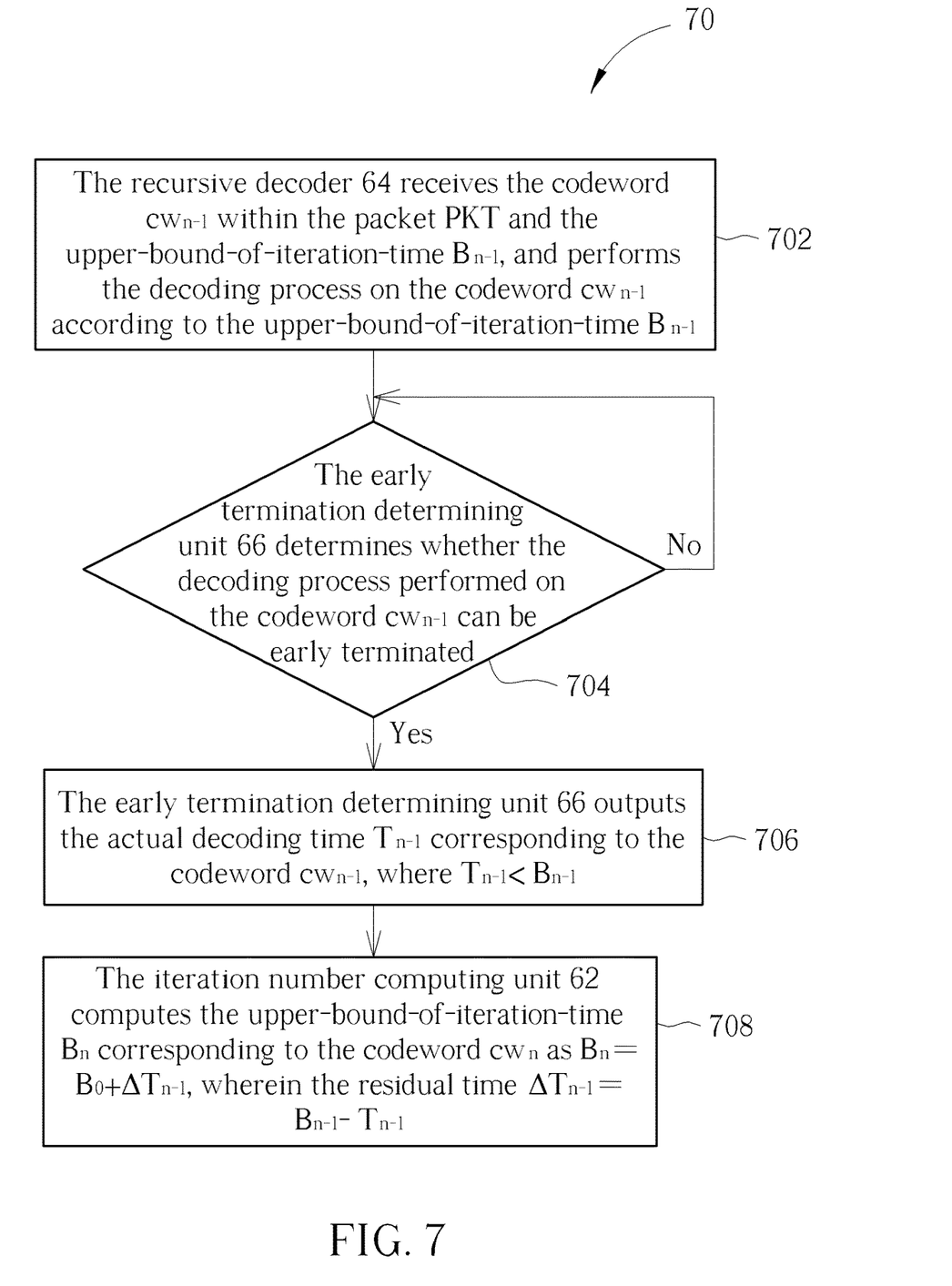
FIG. 7 is a schematic diagram of a decoding process according to an embodiment of the present disclosure.

Operations of the decoding device 60 may be summarized as a decoding process 70, illustrated in FIG. 7. The decoding device 60 or the iteration number computing unit 62 may obtain the defaulted upper-bound-of-iteration-time $B_0$ first and then execute the decoding process 70. When the recursive decoder 64 performs the decoding process on the codeword $cw_{n-1}$ according to the upper-bound-of-iteration-time $B_{n-1}$ (Step 702), the early termination determining unit 66 determines whether the decoding process performed by the recursive decoder 64 on the codeword $cw_{n-1}$ can be early terminated (Step 704). If yes, the early termination determining unit 66 outputs the actual decoding time $T_{n-1}$ corresponding to the codeword $cw_{n-1}$ (Step 706), and the iteration number computing unit 62 computes the upper-bound-of-iteration-time $B_n$ corresponding to the codeword $cw_n$ as $B_n = B_0 + \Delta T_{n-1}$, wherein the residual time $\Delta T_{n-1}$ is $\Delta T_{n-1} = B_{n-1} - T_{n-1}$. In addition, after the iteration number computing unit 62 obtains the upper-bound-of-iteration-time $B_n$, the iteration number computing unit 62 may convert the upper-bound-of-iteration-time $B_n$ into the upper bound of iteration number $I_n$ (in terms of number of iterations) corresponding to the codeword $cw_n$, according to the single iteration time $T_{itr}$.

In an embodiment, the early termination determining unit 66 may comprise a cyclic redundancy check unit (not shown in FIG. 6). The cyclic redundancy check unit is configured to perform a cyclic redundancy check on a decoding-result-for-one-iteration and generate a checking result. The decoding-result-for-one-iteration is a decoding result of the recursive decoder 64 performing one single decoding iteration on the codeword cw (e.g., $cw_{n-1}$). When the checking result indicates that the decoding-result-for-one-iteration is correct, the early termination determining unit 66 determines that decoding of the codeword cw (e.g., $cw_{n-1}$) may be early terminated.

In addition to the cyclic redundancy check, the early termination determining unit 66 may also utilize bit node early termination or other early termination to determine whether to early terminate or not. The early termination of LDPC is known by the art, which is no longer narrated for brevity.

In summary, the decoding device of the present disclosure may dynamically adjust the iteration number of the decoding operation/process performed on the codeword(s) for each packet, for each symbol or even for each codeword. Compared to the prior art, the present disclosure may effectively manage the latency due to the decoding operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decoding device, comprising:
   an iteration number computing unit, configured to perform the following steps:
      receiving a plurality of packet parameters corresponding to a packet, and computing a codeword-number-per-symbol according to the plurality of packet parameters, wherein the packet comprises a plurality of symbols; and
      computing an iteration number according to the codeword-number-per-symbol; and
   a recursive decoder, coupled to the iteration number computing unit, configured to perform a decoding operation on a codeword within a data field of the packet according to the iteration number.

2. The decoding device of claim 1, wherein the iteration number computing unit computes a codeword-number-per-packet and a symbol-number-per-packet according to the plurality of packet parameters of the packet, the iteration number computing unit computes a first codeword-number-per-symbol corresponding to the packet according to the codeword-number-per-packet and the symbol-number-per-packet, and the first codeword-number-per-symbol represents a number of codewords carried by a symbol within the packet on average.

3. The decoding device of claim 2, wherein the iteration number computing unit computes a first iteration number corresponding to the packet according to the first codeword-number-per-symbol, and the recursive decoder performs the decoding operation on all codewords within the data field of the packet according to the first iteration number.

4. The decoding device of claim 3, wherein the iteration number computing unit computes a first decoding-time-per-codeword corresponding to the packet according to a symbol interval and the first codeword-number-per-symbol, and computes the first iteration number according to the first decoding-time-per-codeword and a single iteration time.

5. The decoding device of claim 2, wherein the iteration number computing unit computes the first codeword-number-per-symbol which is related to a ratio of the codeword-number-per-packet in related to the symbol-number-per-packet.

6. The decoding device of claim 1, wherein the iteration number computing unit obtains a coded-bits-per-symbol and a bit-number-per-codeword according to the plurality of packet parameters, and the iteration number computing unit computes a second codeword-number-per-symbol corresponding to a specific symbol within the packet according to the coded-bits-per-symbol and the bit-number-per-codeword.

7. The decoding device of claim 6, wherein the iteration number computing unit computes a second iteration number according to the second codeword-number-per-symbol, and the recursive decoder performs the decoding operation on all codewords within the specific symbol in the packet according to the second iteration number.

8. The decoding device of claim 7, wherein the iteration number computing unit computes a second decoding-time-per-codeword corresponding to the specific symbol according to a symbol interval and the second codeword-number-per-symbol, and computes the second iteration number according to the second decoding-time-per-codeword and a single iteration time.

9. The decoding device of claim 6, wherein the iteration number computing unit computes the second codeword-number-per-symbol which is related to a ratio of an overall-bit-number in related to the bit-number-per-codeword, the overall-bit-number is a summation of the coded-bits-per-symbol and a residual-bit-number, and the residual-bit-number is a number of uncoded bits which are not encoded into at least a codewords in a previous symbol previous to the specific symbol.

10. The decoding device of claim 1, wherein the iteration number is an upper bound of iteration number for the recursive decoder performing the decoding operation on the codeword.

11. A decoding device, comprising:
    a recursive decoder, receiving a first codeword and a first upper-bound-of-iteration-time of a packet, performing a decoding process on the first codeword according to the first upper-bound-of-iteration-time;
    an early termination determining unit, configured to determine whether the decoding process performed by the recursive decoder on the first codeword can be early terminated, wherein the early termination determining unit outputs a first actual decoding time corresponding to the first codeword when the early termination determining unit determines that the decoding process of decoding the first codeword can be early terminated, and the first actual decoding time is less than the first upper-bound-of-iteration-time; and
    an iteration number computing unit, obtaining a defaulted upper-bound-of-iteration-time, configured to compute a second upper-bound-of-iteration-time corresponding to a second codeword, wherein the second upper-bound-of-iteration-time is the defaulted upper-bound-of-iteration-time plus a residual time, and the residual time is the first upper-bound-of-iteration-time minus the first actual decoding time.

12. The decoding device of claim 11, wherein the early termination determining unit comprises a cyclic redundancy check unit, configured to perform a cyclic redundancy check on a decoding-result-for-one-iteration and generate a checking result, the early termination determining unit determines whether the decoding process performed by the recursive decoder on the first codeword can be early terminated according to the checking result, wherein the decoding-result-for-one-iteration is a decoding result of the recursive decoder performing one single decoding iteration on the first codeword.

13. A decoding method, applied in a decoding device, the decoding method comprising:
    receiving a plurality of packet parameters corresponding to a packet, and computing a codeword-number-persymbol according to the plurality of packet parameters, wherein the packet comprises a plurality of symbols, and each symbol comprises at least a codeword;

computing an iteration number according to the codeword-number-per-symbol; and performing a decoding operation on a codeword within a data field of the packet according to the iteration number.

14. The decoding method of claim 13, further comprising:
computing a codeword-number-per-packet and a symbol-number-per-packet according to the plurality of packet parameters of the packet;

computing a first codeword-number-per-symbol corresponding to the packet according to the codeword-number-per-packet and the symbol-number-per-packet, wherein the first codeword-number-per-symbol represents a number of codewords carried by a symbol on average within the packet;

computing a first iteration number corresponding to the packet according to the first codeword-number-per-symbol; and performing the decoding operation on all codewords within the data field of the packet according to the first iteration number.

15. The decoding method of claim 14, wherein the step of computing the first iteration number according to the first codeword-number-per-symbol comprises:
computing a first decoding-time-per-codeword corresponding to the packet according to a symbol interval and the first codeword-number-per-symbol; and computing the first iteration number according to the first decoding-time-per-codeword and a single iteration time.

16. The decoding method of claim 14, wherein the step of computing the first codeword-number-per-symbol corresponding to the packet according to the codeword-number-per-packet and the symbol-number-per-packet comprises:

computing the first codeword-number-per-symbol which is related to a ratio of the codeword-number-per-packet in related to the symbol-number-per-packet.

17. The decoding method of claim 13, further comprising:
obtaining a coded-bits-per-symbol and a bit-number-per-codeword according to the plurality of packet parameters;

computing a second codeword-number-per-symbol corresponding to a specific symbol within the packet according to the coded-bits-per-symbol and the bit-number-per-codeword;

computing a second iteration number according to the second codeword-number-per-symbol; and performing the decoding operation on all codewords within the specific symbol in the packet according to the second iteration number.

18. The decoding method of claim 17, wherein the step of computing the second iteration number according to the second codeword-number-per-symbol comprises:
computing a second decoding-time-per-codeword corresponding to the specific symbol according to a symbol interval and the second codeword-number-per-symbol; and computing the second iteration number according to the second decoding-time-per-codeword and a single iteration time.

19. The decoding method of claim 17, wherein the step of computing the second codeword-number-per-symbol according to the coded-bits-per-symbol and the bit-number-per-codeword comprises:
computing the second codeword-number-per-symbol which is related to a ratio of an overall-bit-number in related to the bit-number-per-codeword, wherein the overall-bit-number is a summation of the coded-bits-per-symbol and a residual-bit-number, and the residual-bit-number is a number of uncoded bits which are not coded into at least a codewords in a previous symbol previous to the specific symbol.

* * * * *